(12) United States Patent
Rao et al.

(10) Patent No.: US 8,395,152 B2
(45) Date of Patent: Mar. 12, 2013

(54) STABLE P-TYPE SEMICONDUCTING BEHAVIOUR IN LI AND NI CODOPED ZNO

(75) Inventors: M. S. Ramachandra Rao, Tamilnadu (IN); E. Senthil Kumar, Tamilnadu (IN)

(73) Assignee: Indian Institute of Technology Madras, Chennai, Tamil Nadu (IN)

( * ) Notice: Subject to any disclaimer, the term of this patent is extended or adjusted under 35 U.S.C. 154(b) by 0 days.

(21) Appl. No.: 13/448,472

(22) Filed: Apr. 17, 2012

(65) Prior Publication Data

US 2012/0199828 A1     Aug. 9, 2012

Related U.S. Application Data

(62) Division of application No. 12/643,992, filed on Dec. 21, 2009, now Pat. No. 8,187,976.

(30) Foreign Application Priority Data

Aug. 26, 2009    (IN) .......................... 2054/CHE/2009

(51) Int. Cl.
    *H01L 29/12* (2006.01)
(52) U.S. Cl. ......................................... 257/43; 438/690
(58) Field of Classification Search .................... 257/43; 438/690
    See application file for complete search history.

(56) References Cited

U.S. PATENT DOCUMENTS

| 5,506,077 | A | 4/1996 | Koksbang |
| 5,625,202 | A | 4/1997 | Chai |
| 7,303,815 | B2 * | 12/2007 | Yang et al. ............. 428/357 |
| 2010/0000466 | A1 * | 1/2010 | Liu et al. ................. 118/620 |

OTHER PUBLICATIONS

Notification of Transmittal of the International Search Report and the Written Opinion of the International Searching Authority, Nov. 23, 2010.
Huang et al., "Synthesis, Structure, and Room-Temperature Ferromagnetism of Ni-doped ZnO Nanoparticles", Journal of Material Science, 2007, pp. 6464-6468, vol. 42, Issue 15.
Wikipedia, "Light Emitting Diode", accessed at http://web.archive.org/web/20110717124143/http://en.wikipedia.org/wiki/Light-emitting_diode, Jul. 17, 2011.
Pei Guangqing et al., "Studies of Magnetic Interactions in Ni-Doped ZnO from First-Principles Calculations", Computational Materials Science, Sep. 2008, pp. 489-494, vol. 43, Issue 3.
L. Petit et al., "Electronic Structure of Transition-Metal Impurities in p-type ZnO", Physical Review B, 2006, vol. 73, Issue 4, pp. 045107-1-045107-5, doi: 10.1103/PhysRevB.73.045107.
Tsukazaki Atsushi et al., "Repeated Temperature Modulation Epitaxy for p-type Doping and Light-Emitting Diode Based on ZnO", Nature Materials, 2005, vol. 4, Issue 1, pp. 42-46, doi: 10.1038/nmat1284.
Hai Zhu et al., "Ultralow-Threshold Laser Realized in Zinc Oxide", Advanced Materials, 2009, vol. 21, Issue 16, pp. 1613-1617, doi: 10.1002/adma.200802907.
Jae-Hong Lim et al., "UV Electroluminescence Emission from ZnO Light-Emitting Diodes Grown by High-Temperature Radiofrequency Sputtering", Advanced Materials, 2006, vol. 18, Issue 20, pp. 2720-2724, doi: 10.1002/adma.200502633.
Y. Y. Xi et al., "NiO/ZnO Light Emitting Diodes by Solution-Based Growth", Applied Physics Letters, 2008, vol. 92, Issue 11, pp. 113505-01-113505-03, doi: 10.106311.2898505.

(Continued)

*Primary Examiner* — David Vu
*Assistant Examiner* — Brandon Fox
(74) *Attorney, Agent, or Firm* — Ren-Sheng International

(57) ABSTRACT

A method is provided for growing a stable p-type ZnO thin film with low resistivity and high mobility. The method includes providing an n-type Li—Ni co-doped ZnO target in a chamber, providing a substrate in the chamber, and ablating the target to form the thin film on the substrate.

20 Claims, 7 Drawing Sheets

OTHER PUBLICATIONS

H. S. Kim et al., "Phosphorus Doped ZnO Light Emitting Diodes Fabricated Via Pulsed Laser Deposition", Applied Physics Letters, 2008, vol. 92, pp. 112108-1-112108-3, doi: 10.1063/1.2900711.

Z. Y. Xiao et al., "Stability of p-type Conductivity in Nitrogen-doped ZnO Thin Film", Applied Physics Letters, 2008, vol. 92, Issue 5, pp. 052106-1-052106-3, doi: 10.1063/1.2838330.

L. Dunlop et al., "Reproducible Growth of p-Type ZnO:N Using a Modified Atomic Layer Deposition Process Combined with Dark Annealing", Applied Physics Letters, 2008, vol. 93, Issue 17, pp. 172111-1-172111-3, doi: 10.1063/1.3000604.

Arnold Allenic et al., "Amphoteric Phosphorus Doping for Stable p-Type ZnO", Advanced Materials, 2007, vol. 19, Issue 20, pp. 3333-3337, doi: 10.1002/adma.200700083.

Jun-Yan Zhang et al., "Ultraviolet Electroluminescence from Controlled Arsenic-Doped ZnO Nanowire homojunctions", Applied Physics Letters, 2008, vol. 93, Issue 2, pp. 021116-1-021116-3, doi: 10.1063/1.2958230.

S.H. Jeong et al., "Physical Properties and Etching Characteristics of Metal (Al, Ag, Li) Doped ZnO Films Grown by RF Magnetron Sputtering", Thin Solid Films, 2008, vol. 516, Issue 19, pp. 6598-6603, doi: 10.1016/j.tsf.2007.11.034.

Sudhakar Shet et al., "Carrier Concentration Tuning of Bandgap-Reduced p-type ZnO Films by Codoping of Cu and Ga for Improving Photoelectrochemical Response", Journal of Applied Physics, 2008, vol. 103, pp. 073504-1-073504-5, doi: 10.1063/12888578.

L. J. Mandalapu et al., "p-Type Behavior from Sb-doped ZnO Heterojunction Photodiodes", Applied Physics Letters, 2006, vol. 88, Issue 11, pp. 112108-1-112108-3, doi: 10.1063/1.2186516.

Eun-Cheol Lee et al., "Possible p-type Doping with Group-I Elements in ZnO", Physical Review B, 2004, vol. 70, Issue 11, pp. 115210-1-115210-4, doi: 10.1103/PhysRevB.70.115210.

Y. J. Zeng et al., "Dopant Source Choice for Formation of p-type ZnO: Li Acceptor", Applied Physics Letters, 2006, vol. 88, Issue 6, id. 062107, pp. 062107-1-062107-3, doi: 10.1063/1.2172743.

B. Yao et al., "P-Type Conductivity and Stability of Nitrogen-Doped Zinc Oxide Prepared by Magnetron Sputtering", Journal of Luminescence, 2007, vol. 122-123, pp. 191-194, doi: 10.1016/j.jlumin.2006.01.088.

J. -R. Duclere et al., "Properties of Li-, P- and N-doped ZnO Thin Films Prepared by Pulsed Laser Deposition", Superlattices and Microstructures, 2005, vol. 38, Issue 4-6, pp. 397-405, doi: 10.1016/j.spmi.2005.08.011.

Y R Sui et al., "Fabrication and Properties of B—N Codoped p-type ZnO Thin Films", Journal of Physics D: Applied Physics, 2009, vol. 42, Issue 6, pp. 065101 (1-5), doi: 10.1088/0022-3727/42/6/065101.

Marcel H. F. Sluiter et al., "First Principles Based Design and Experimental Evidence for a ZnO-Based Ferromagnet at Room Temperature", Physics Review Letters, May 13, 2005, vol. 94, Issue 18, pp. 187204-1-187204-4, doi: 10.1103/PhyRevLett.94.187204.

* cited by examiner

STABLE P-TYPE SEMICONDUCTING BEHAVIOUR IN LI AND NI CODOPED ZNO

CROSS-REFERENCE TO RELATED APPLICATION

The present application is a divisional application of U.S. Nonprovisional application Ser. No. 12/643,992, filed on Dec. 21, 2009 and entitled "STABLE P-TYPE SEMICONDUCTING BEHAVIOUR IN LI AND NI CODOPED ZNO," which claims the benefit of India Application No. 2054/CHE/2009, filed on Aug. 26, 2009. The U.S. Nonprovisional Application, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

Diode based light sources are used everyday in a variety of applications right from blinking lights in indicators to modern communication systems, lighting applications, optical storage media etc. Solid state lighting is the holy grail for inexpensive and efficient lighting systems in future. The approach is to produce a commercially viable, low cost, and a successful high efficient lighting device that can act as a catalyst to reduce global warming (low carbon footprint). Earlier approaches relied on III-V based semiconductor materials, which are expensive and have issues of stability, and manufacturing process.

ZnO has always been considered as one of the most promising material candidates for ultraviolet light emitting diodes and laser diodes because of its direct-wide band gap (3.37 eV) and relatively large exciton binding energy (60 meV), compared with that of GaN (25 meV) and ZnSe (22 meV), at room temperature. The successful demonstration of room temperature electroluminescence from ZnO based homo- and heterojunctions has proved that the material is ideal for the next generation short wavelength optoelectronic devices. Recent studies focus on the growth of p-type ZnO, which has the problems of doping asymmetry and the stability of p-type conductivity. All possible p-type dopants, such as, group-V elements [N, P, As, Sb], group-I and IB elements [Li, Na, K, Ag, Cu], have been tried to realize p-type conduction and ultraviolet (UV)-electroluminescence in ZnO. Nitrogen substitution at the oxygen site in ZnO appears to be promising for p-type conduction and many groups have reported room temperature electroluminescence from N doped ZnO based homojunctions. Dopants such as P, As and Sb seem to be good candidates for p-type conduction on ZnO. Among group I elements, theoretically Li possesses shallow accepter levels. However, no electroluminescence is achieved from Li substituted (LiZn) ZnO based homojunctions. In contrary to theoretical predictions, it was observed experimentally that Li doping in ZnO increases the resistivity drastically to several orders and makes it insulating.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

In the Drawings.

DETAILED DESCRIPTION

Figure 1:
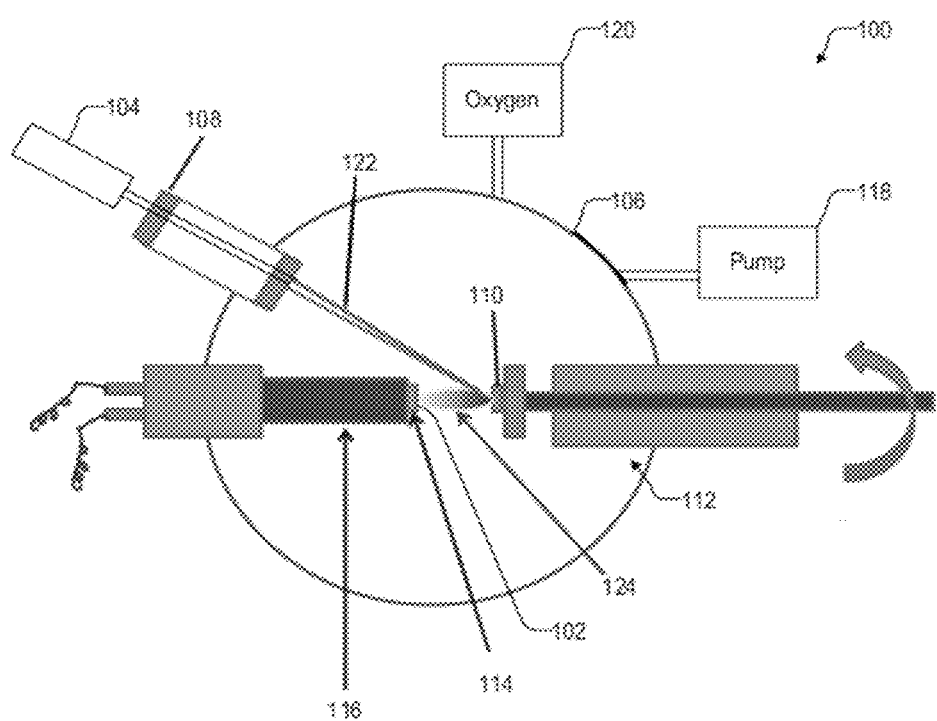
FIG. 1 illustrates a schematic of an example pulsed laser deposition apparatus for growing a stable p-type ZnO thin film in one or more embodiments of the present disclosure.

In the following detailed description, reference is made to the accompanying drawings, which form a part hereof. In the drawings, similar symbols may identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

This disclosure is drawn, inter alia, to methods, apparatus, and systems related to fabricating a stable p-type zinc oxide (ZnO) thin film with low resistivity and high Hall mobility. In one or more embodiments of the present disclosure, a lithium (Li) and a transition metal, such as nickel (Ni), codoped p-type ZnO thin film may be grown by pulsed laser deposition (PLD). The Li—Ni codoped p-type ZnO thin film may have a decrease in resistivity compared to Li monodoped ZnO film.

The Li—Ni codoped p-type ZnO thin film may have stable p-type conduction with high mobility at room temperature. The Li—Ni codoped p-type ZnO thin film may be stable even under UV illumination. For example, the Li—Ni codoped p-type ZnO thin film has, at room temperature, a resistivity of about 0.01 to 1 Ωcm (e.g., 0.15 Ωcm), a hole concentration of $10^{17}$ cm$^{-3}$ to $10^{18}$ cm$^{-3}$ (e.g., $3.2*10^{17}$ cm$^{-3}$), and a mobility of 80 to 250 cm$^2$V$^{-1}$s$^{-1}$ (e.g., 130 cm$^2$V$^{-1}$s$^{-1}$). Instead of PLD, other physical vapor deposition techniques may be used, such as sputtering, molecular beam epitaxy, and chemical vapor deposition (e.g., metalorganic chemical vapor deposition).

FIG. 1 illustrates a schematic of an example pulsed laser deposition apparatus 100 for growing a stable p-type ZnO thin film 102 in one or more embodiments of the present disclosure. P-type ZnO thin film 102 may be a Li—Ni codoped p-type ZnO thin film. Apparatus 100 may include a laser 104, a vacuum chamber 106 with a quartz window 108, a target 110 on a rotatable target holder 112, a substrate 114 on a heatable substrate holder 116, a vacuum pump 118, and a oxygen source 120. Target 110 may be a Li—Ni codoped n-type ZnO target. Laser 104 may provide a pulsed laser beam 122 that passes through quartz window 108 and strikes a rotating target 110 in vacuum chamber 106. Material may be ablated (e.g., vaporized) from target 110 and a plume 124 may be deposited as thin film 102 on heated substrate 114. Laser 104 may be a Q-switched Nd:YAG (neodymium-doped yttrium aluminium garnet) laser. Substrate 114 may be a quartz substrate or a device substrate with one or more semiconductor layers.

Figure 2:
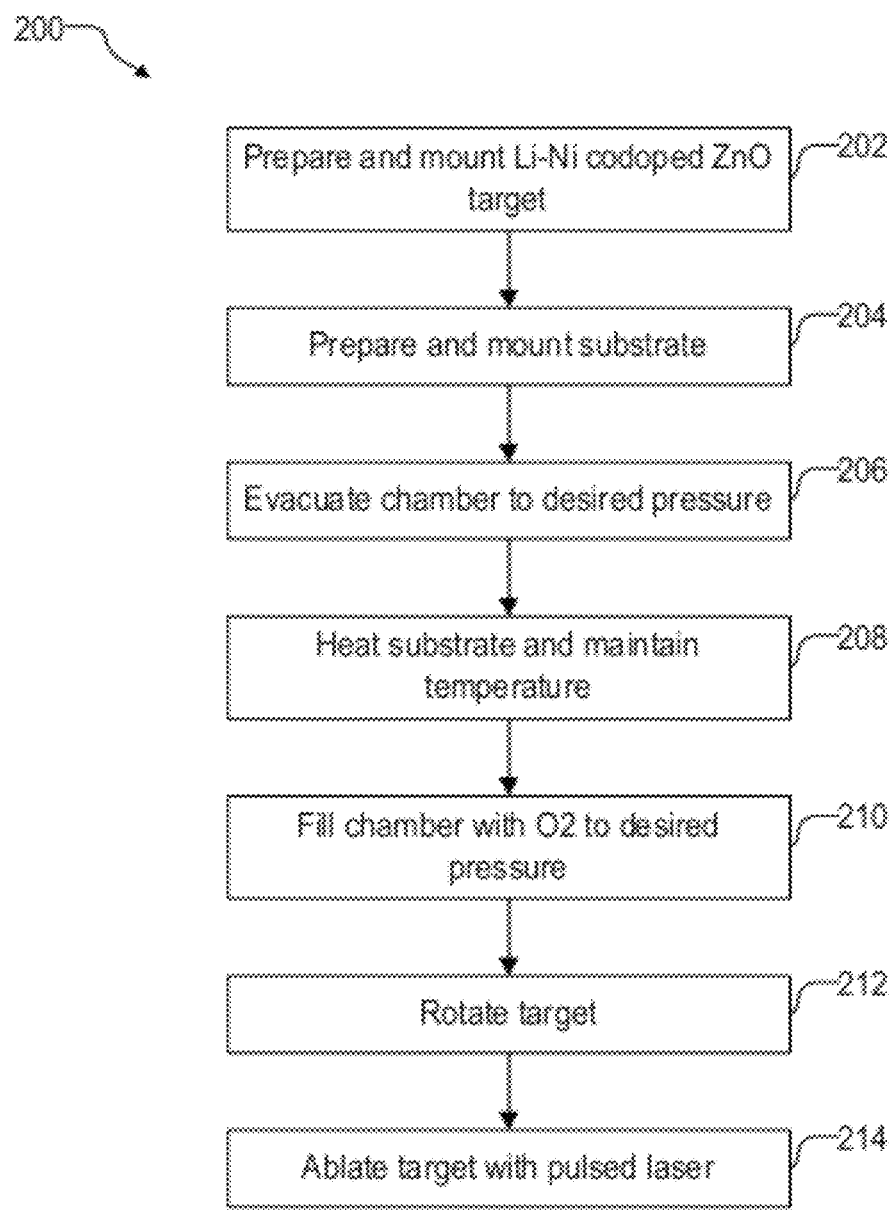
FIG. 2 is a flowchart of an example method for operating the apparatus of FIG. 1 to grow the stable p-type ZnO thin film in one or more embodiments of the present disclosure.

FIG. 2 is a flowchart of an example method 200 for operating apparatus 100 to grow thin film 102 in one or more embodiments of the present disclosure. Method 200 may include blocks 202, 204, 206, 208, 210, 212, and 214. Method 200 may be implemented by a human operator or a computer program using semiconductor manufacturing equipment, or a combination thereof.

In block 202, Li—Ni codoped n-type ZnO target 110 is prepared and mounted to rotatable target holder 112. The formula for target 100 may be $Zn_{1-x-y}Li_xNi_yO$. The mole percentage of Li may range from 1 to 3 mol %, and the mole percentage of Ni may range from 1 to 2 mol %. In one or more embodiments of the present disclosure, x=0.02 and y=0.02.

In one or more embodiments of the present disclosure, target 110 may be formed by a solid state reaction method where stoichiometric amounts of ZnO, lithium carbonate ($Li_2CO_3$), and nickel oxide (NiO) (96 mol % Zn, 2 mol % Li, and 2 mol % Ni) are mixed and ground well for 60 minutes. The mixture may be heated at about 750° C. for 12 hours. The powder may again be ground for 30 minutes and pressed in to pellets. The pellets may be sintered at 950° C. for 15 hours. The resulting pellets may form a Li—Ni codoped n-type ZnO polycrystalline target 110.

In the above process, it may be difficult to control oxygen vacancies in the pellets while sintering. The sintering is typically done in atmospheric air so target 110 may contain many oxygen vacancies, which is responsible for n-type conductivity. The resistivity of Li—Ni codoped n-type ZnO target 100 may be very high (e.g., ~KΩcm).

In order to provide a clean and fresh surface of the target to interact with the incident laser beam, the top surface of target 110 may be removed with sandpaper and the top layer of the target may be lapped by laser pulse for about one minute before the actual deposition.

In block 204, substrate 114 is prepared and mounted to heatable substrate holder 116. As described above, substrate 114 may be quartz or a device substrate with one or more semiconductor layers. When substrate 114 is a quartz substrate, it may be cleaned with an ultrasonic cleaner using ethanol, acetone, and deionized water. When substrate 114 is a device substrate, it may be cleaned according to the material of the substrate. For example, for a silicon substrate, the top silicon dioxide ($SiO_2$) layer may be removed with etching with hydrofluoric acid (HF).

In block 206, a pump 118 may evacuate vacuum chamber 106 to a desired pressure. In one or more embodiments of the present disclosure, the desired pressure may be about $4*10^{-6}$ millibar (mb) (e.g., with a range of ±10%).

In block 208, heatable substrate holder 116 may heat and maintain substrate 114 at a desired temperature. In one or more embodiments of the present disclosure, the desired temperature may be about 400° C. (e.g., with a range of ±10° C.).

In block 210, an oxygen source 120 may fill vacuum chamber 106 with oxygen to a desired partial pressure. In one or more embodiments of the present disclosure, the desired partial pressure of oxygen may be about 0.15 mbar (e.g., with a range of ±10%).

In block 212, rotatable target holder 112 may rotate target 114 to a desired rotation per minute (RPM) so laser 104 does not hit the same spot consecutively. In one or more embodiments of the present disclosure, the desired RPM may be 200.

In block 214, laser 104 may ablate target 114 for a desired duration under desired laser parameters to grow Li—Ni codoped ZnO thin film 102 on substrate 114. As described above, thin film 102 has stable p-type conduction with low resistivity and high mobility at room temperature. In one or more embodiments of the present disclosure, the desired duration may be 5 to 30 minutes (e.g., 10 minutes) and the desired laser parameters may be as follows: wavelength ~193 to 355 nanometers (nm) (e.g., 355 nm); energy ~85 to 100 millijoule (mJ)/pulse (e.g., 85 mj/pulse); pulse width ~5 to 25 nanoseconds (ns) (e.g., 19 ns); laser fluence 2.5 to 3.0 joules/cm$^2$ (e.g., 2.7 joules/cm$^2$), and frequency ~1 to 10 hertz (Hz) (e.g., 10 Hz). Thin film 102 may be approximately 300 nm thick.

Li—Ni codoped ZnO thin film 102 may be predominantly orientated along c-axis (002) direction of the wurtzite hexagonal structure in contrast to Li—Ni codoped ZnO target 114. Furthermore, it may be possible to precisely control the oxygen vacancies in thin film 102 by adjusting the oxygen partial pressure in vacuum chamber 106. Hence, Li—Ni codoped ZnO thin film 102 shows stable p-type conduction with suitable semiconductor nature.

For comparison, ZnO, $Zn_{1-x}Li_xO$ (2 mol % of Li monodoped ZnO thin film), and $Zn_{1-y}Ni_yO$ (2 mol % of Ni monodoped ZnO thin film) thin films may also be grown using method 200 with the same conditions. For example, Li monodoped and Ni monodoped ZnO targets may be prepared by the same grinding and heating conditions as the Li—Ni codoped ZnO target but using only $Li_2CO_3$ or NiO. Crystalline phase of example ZnO, Li monodoped ZnO thin film, Ni monodoped ZnO thin film, and Li—Ni codoped ZnO thin film were analyzed by X'Pert Pro, an X-ray diffractometer from PANalytical of Almelo, the Netherlands, using Cu K$_\alpha$ radiation. Electrical resistivity, carrier concentration, and Hall mobility of the ZnO thin films were measured by Physical Property Measurement System (PPMS) from Quantum Design of San Diego, Calif. X-ray photoelectron spectroscopy (XPS) measurements were performed using VersaProbe from Physical Electronics, Inc. of Chanhassen, Minn.

Figure 3:
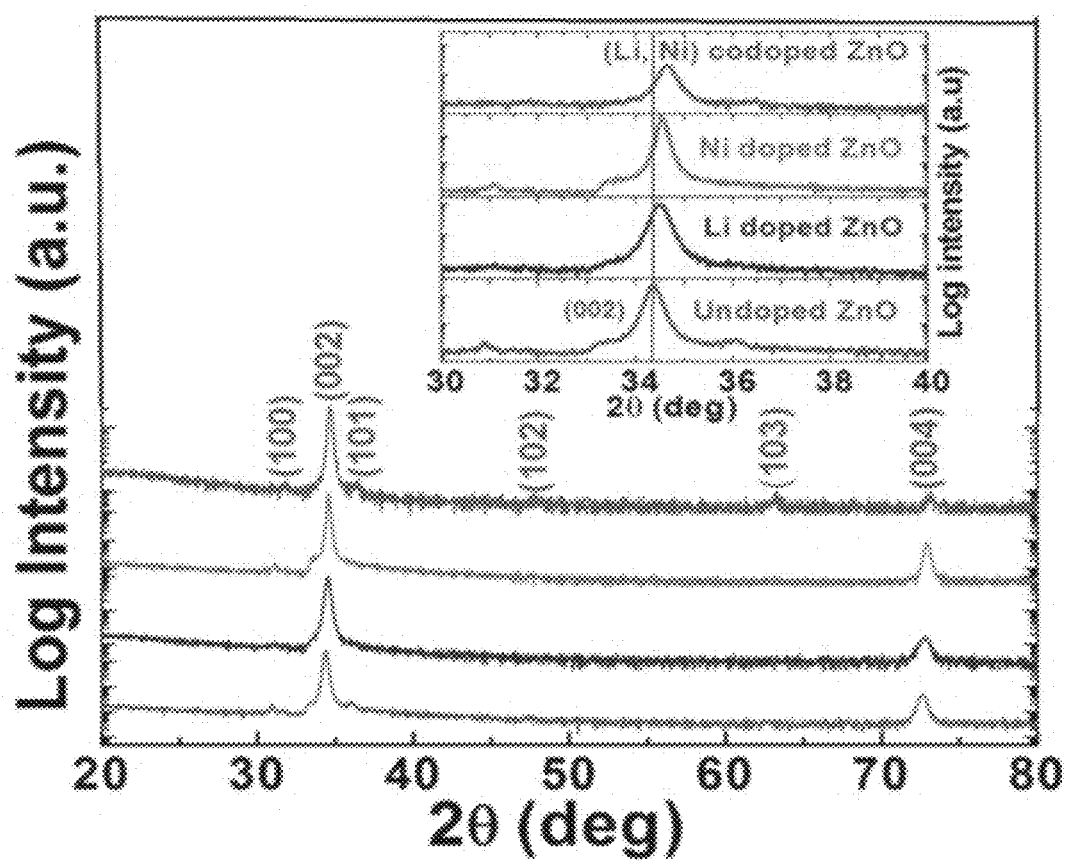
FIG. 3 illustrates X-ray diffraction patterns of example undoped, Li monodoped, Ni monodoped, and Li—Ni codoped ZnO thin films in one or more embodiments of the present disclosure.

FIG. 3 shows X-ray diffraction (XRD) patterns of example ZnO thin films in one or more embodiments of the present disclosure. FIG. 3 includes an insert showing magnification of (002) ZnO peaks. The X-ray diffraction patterns reveal that the ZnO thin films are predominantly oriented in c axis (002) direction of the wurtzite hexagonal structure.

Figure 4:
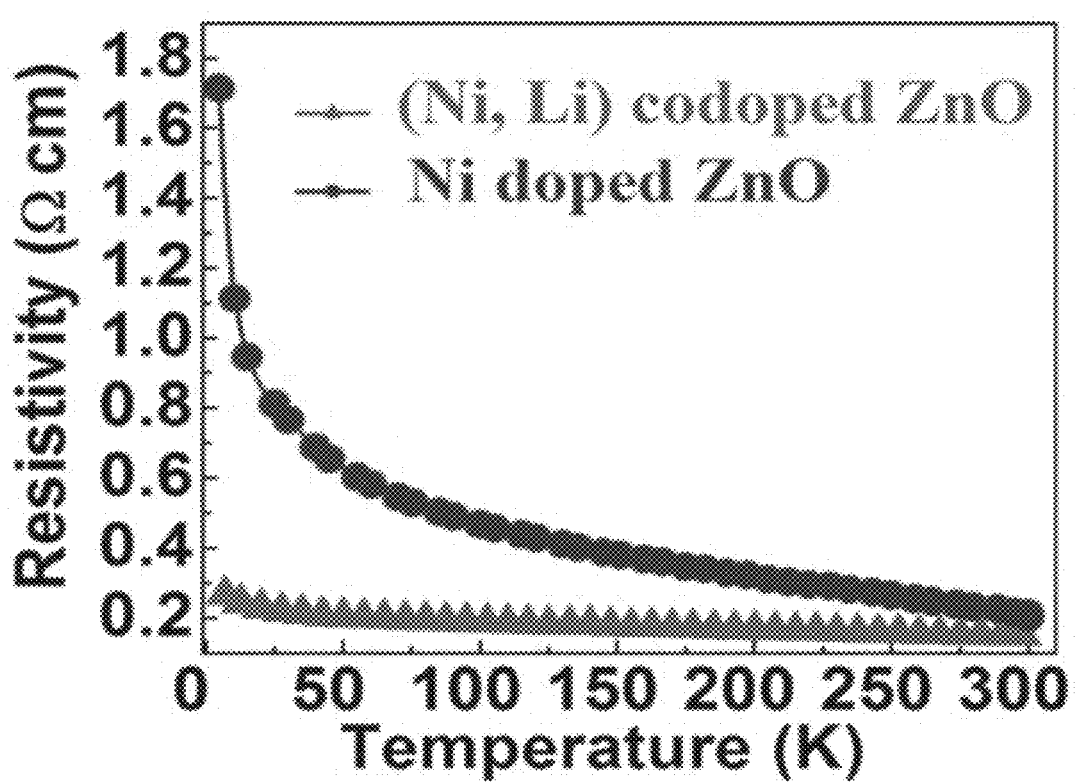
FIG. 4 is a plot of the temperature dependence of resistivity of the example Ni monodoped and Li—Ni codoped ZnO thin films in one or more embodiments of the present disclosure.

Room temperature electrical transport measurements show that the Li monodoped ZnO thin film has a high resistivity of $4 \times 10^3$ Ωcm. Due to this high resistivity, further Hall effect measurements were not done on this thin film. FIG. 4 gives the temperature dependence of resistivity of the Ni monodoped and Li—Ni codoped ZnO thin films in one or more embodiments of the present disclosure. It can be clearly seen that Li—Ni codoped ZnO thin film has the lowest resistivity of about 0.15 Ωcm, which is four order less when compared to that of the Li monodoped ZnO thin film. Ni monodoped ZnO thin film shows a room temperature resistivity of 0.21 Ωcm.

Figure 5:
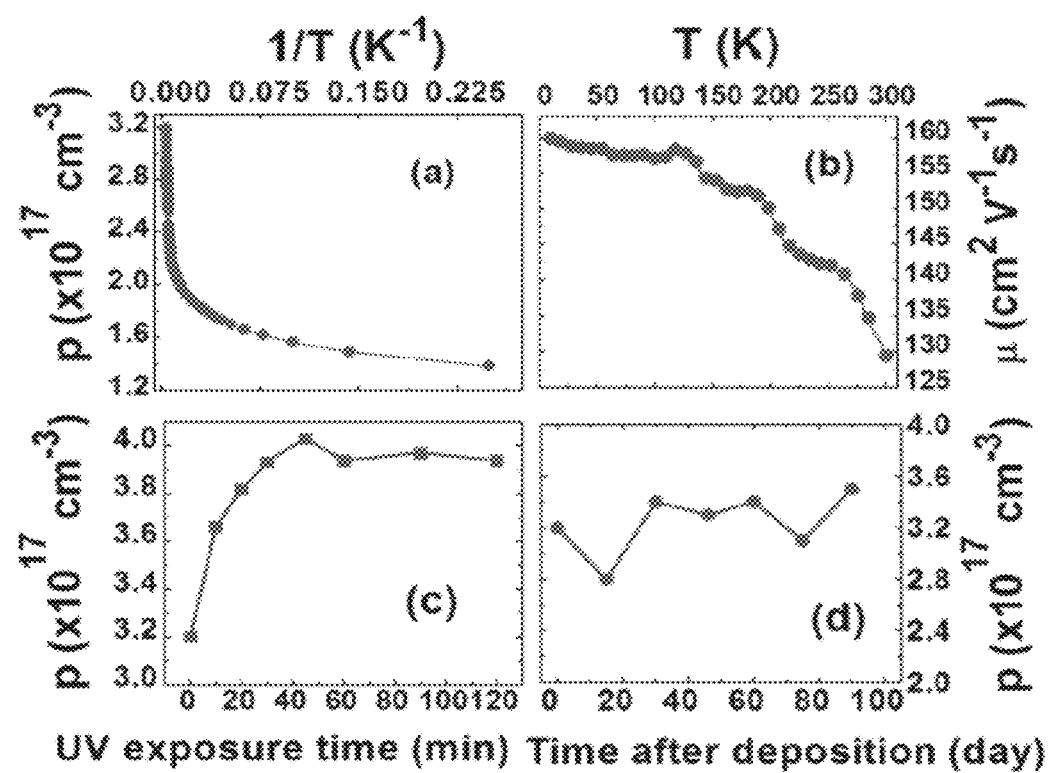
FIG. 5A is a plot of the temperature dependence of hole concentration of the example Li—Ni codoped ZnO thin film in one or more embodiments of the present disclosure.
FIG. 5B is a plot of temperature variation of mobility of the example Li—Ni codoped ZnO thin film in one or more embodiments of the present disclosure.
FIG. 5C is a plot of apparent hole concentration with UV exposure time of the example Li—Ni codoped ZnO thin film in one or more embodiments of the present disclosure.
FIG. 5D is a plot of apparent hole concentration as a function of the time after deposition of the example Li—Ni codoped ZnO thin film in one or more embodiments of the present disclosure.

FIGS. 5A and 5B show the temperature dependence of Hall (T-Hall) measurements of Li—Ni codoped ZnO thin film in one or more embodiments of the present disclosure. The thin film shows stable p-type conductivity for the complete temperature range, which indicates that holes are the only major carriers in the system. At room temperature, the thin film has a hole concentration of about $3.2*10^{17}$ cm$^{-3}$ and a mobility of about 130 cm$^2$V$^{-1}$s$^{-1}$. The mobility increases with decrease in temperature and a maximum value of 160 cm$^{-2}$V$^{-1}$s$^{-1}$ is observed at 5 Kelvin (K).

FIG. 5C shows that that the p-type conductivity is highly stable even when the Li—Ni codoped ZnO thin film is exposed to UV radiation (365 nm) continuously for 120 minutes in one or more embodiments of the present disclosure. Moreover, the hole concentration is found to increases slightly with UV illumination and saturates after 40 minutes of exposure time and remains the same up to 120 minutes of UV exposure.

FIG. 5D illustrates the hole concentration with time after deposition in one or more embodiments of the present disclosure. Over a span of 100 days, Hall effect measurements were carried out seven times to examine the stability of p-type conduction with time. The measurement results show that the thin film retains its p-type behavior even after 100 days with almost same hole concentration as that obtained on the day of deposition (e.g., ±20%). For example, the hole concentration starts around $3.2*10^{17}$ cm$^{-3}$ and ranged from $2.8*10^{17}$ cm$^{-3}$ to $3.6*10^{17}$ cm$^{-3}$ (±15%) over the 100 days. This result clearly indicates that the Li—Ni codoped p-type ZnO thin film is highly stable.

Figure 6A:
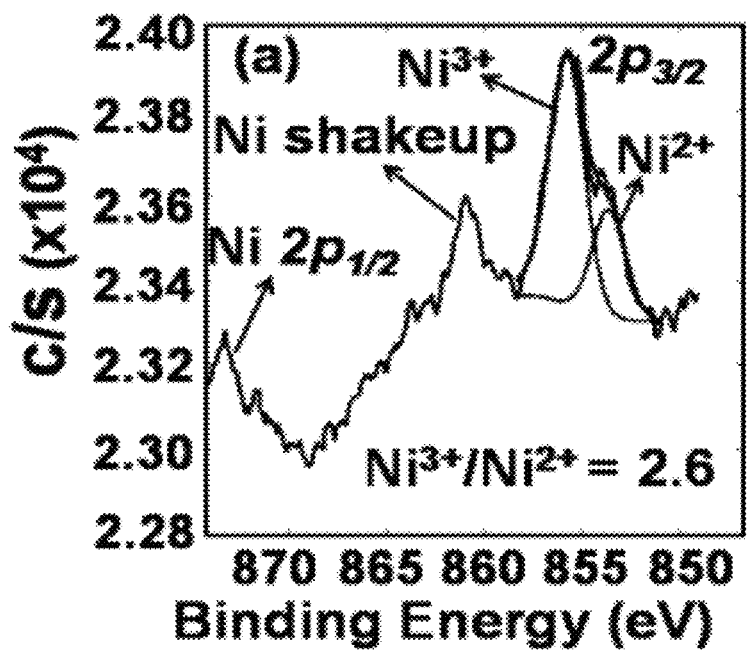
FIG. 6A is a plot of X-ray photoelectron spectroscopy (XPS) spectrum of the example Ni monodoped ZnO thin film in one or more embodiments of the present disclosure.
Figure 6B:
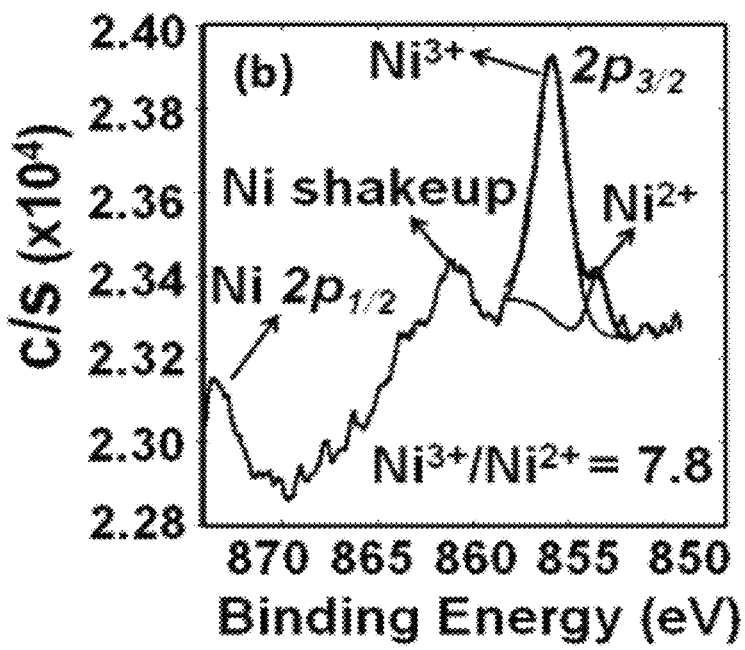
FIG. 6B is a plot of XPS spectrum of the example Li—Ni codoped ZnO thin film in one or more embodiments of the present disclosure.

It is surprising to note that Li—Ni codoped p-type ZnO thin films exhibit low resistivity of about 0.15 Ωcm, while comparing with dual-acceptor doped Li—N codoped p-type ZnO system. The low resistivity, high mobility, and stable p-type conduction may be explained as follows. Theoretical calculations have reported that due to the minimum total energy of ferromagnetic (FM) and antiferromagnetic (AFM) states, while codoping Li and Ni in ZnO, Li ions tend to substitute the sites near Ni ions. Others have reported that when a transition metal (TM) alone is doped in ZnO, a stable TM$^{2+}$ configuration is favored, whereas, TM$^{3+}$ configuration is favored when an additional hole is introduced in to the ZnO system. Thus in Li—Ni codoped ZnO system, Li ion is likely to be at the nearest site of Ni ion and hence promotes Ni$^{2+}$ into Ni$^{3+}$. Where as in Ni monodoped ZnO system, the most favorable state for Ni ion is Ni$^{2+}$. This is confirmed by XPS measurements as shown in FIGS. 6A and 6B. In the codoped system, the Ni$^{3+}$ ion will act as a reactive donor, like (Li, Al) and (N, In) codoped ZnO systems, and increases the Li solubility limit by forming Li—Ni complexes.

FIG. 6A gives the XPS spectrum of Ni monodoped ZnO thin film. For 2 mol % of Ni monodoped ZnO thin film, Ni 2p$_{3/2}$ level consists of two peaks centered around 853.63 eV and 855.74 eV corresponding to Ni$^{2+}$ and Ni$^{3+}$ chemical states respectively.

The area ratio (Ni$^{3+}$/Ni$^{2+}$) of the Ni$^{3+}$ and Ni$^{2+}$ ion is found be 2.6. FIG. 6B shows that for Li—Ni codoped ZnO thin film, peaks corresponding to Ni$^{2+}$ and Ni$^{3+}$ chemical states are centered at 853.49 eV and 855.85 eV respectively. The area ratio of Ni$^{3+}$/Ni$^{2+}$ ion for this codoped system is 7.8. This clearly indicates that in the Li—Ni codoped ZnO system, the most favorable chemical state of Ni ion is Ni$^{3+}$.

The stable p-type ZnO thin film can be used in a variety of applications, such as UV/blue laser diodes and light-emitting diodes in conjunction with N-type ZnO. By using appropriate frequency doubling, the UV light generated from ZnO heterostructures can be used for water purification. The stable p-type ZnO thin film can also be used for dilute magnetic semiconductor (DMS), which has potential applications in the emerging areas of spintronics. In general, the stable p-type ZnO thin film may find application in solid state lighting, spintronics, memory storage, optical read/write devices, and storage devices in general.

Figure 7:
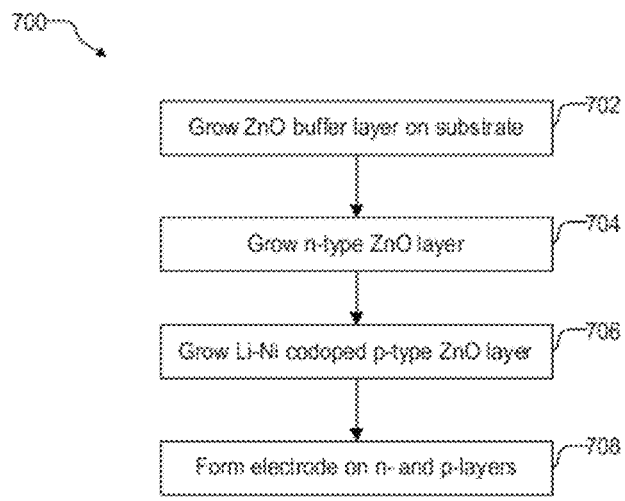
FIG. 7 is a flowchart of an example method to grow a ZnO based homojunction light-emitting diode (LED) on a substrate in one or more embodiments of the present disclosure.

FIG. 7 is a flowchart of an example method 700 to grow a ZnO based homojunction light-emitting diode (LED) 800 (FIG. 8) on a substrate 802 in one or more embodiments of the present disclosure. Method 700 may include blocks 702, 704, 706, and 708. Method 700 may be implemented by a human operator or a computer program using semiconductor manufacturing equipment, or a combination thereof.

In block 702, a ZnO buffer layer 804 may be grown over substrate 802. Substrate 802 may be sapphire. Buffer layer 804 may be an undoped intrinsic ZnO layer. Buffer layer 804 may be grown using PLD under a chamber pressure of 100 to 300 mbar of oxygen. Buffer layer 804 may be 100 nm.

In block 704, an n-type ZnO layer 806 may be grown over buffer layer 804. N-type layer 806 may be an aluminum (Al) doped ZnO thin film. Typically a 2 mol % of Al doped ZnO provides an electron concentration of the order of $10^{19}$ cm$^{-3}$.

In one or more embodiments of the present disclosure, n-type layer 806 may be grown using PLD with an Al doped ZnO target. The stoichiometric mixture of Al$_2$O$_3$ and ZnO powder (2 mol % Al and 98 mol % Zn) are ground for about 1 hour. The powder is heated at 1,000° C. for 15 hours. The powder is ground again for 30 minutes and pressed into pellets. The pellets are sintered at 1,200° C. for 24 hours. The result pellets may form a Al doped ZnO target.

Method 200 described above may be used to grow n-type layer 806 with the Al doped ZnO target. To realize crystalline and epitaxial thin film, the growth temperature and the chamber pressure may be 600° C. and 10$^{-2}$ mbar of oxygen. N-type layer 806 may be 500 nm.

In block 706, a Li—Ni codoped p-type ZnO layer 808 may be grown over n-type layer 806. P-type layer 808 may be grown using method 200 described above. P-type layer 808 may be 300 nm.

In block 708, n-type electrode 810 and p-type electrode 812 may be formed on n-type layer 806 and p-type layer 808, respectively. Electrodes 810 and 812 may be Ti/Au electrodes, which are formed by sequentially depositing Ti followed by Au.

Figure 8:
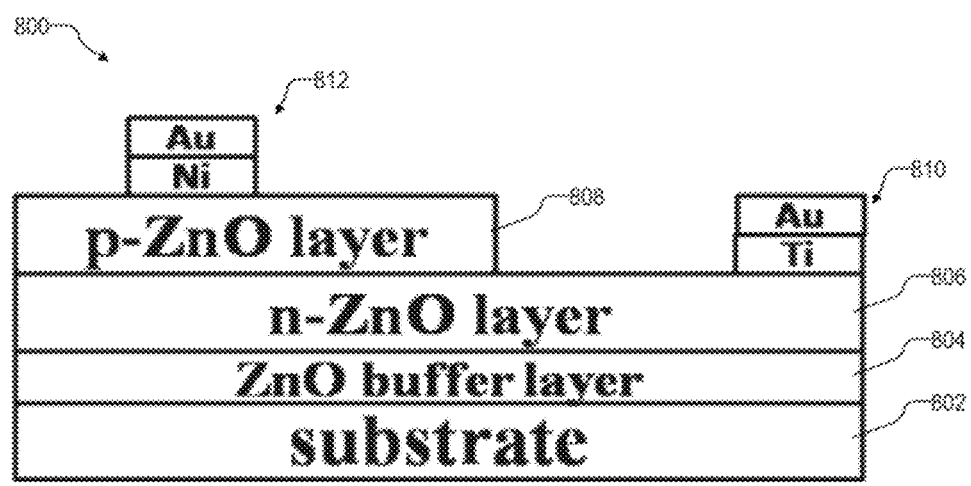
FIG. 8 is a cross-sectional view of an example LED device fabricated from the method of FIG. 7 in one or more embodiments of the present disclosure.

FIG. 8 is an example ZnO based homojunction LED 800 in one or more embodiments of the present disclosure. LED 800 may include sapphire substrate 802, ZnO buffer layer 804 over the substrate, n-type ZnO layer 806 over the buffer layer, Li—Ni codoped p-type ZnO layer 808 over the n-type layer, n-type electrode 810 on the n-type layer, and p-type electrode 812 on the p-type layer.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A data processing system may be implemented utilizing any suitable commercially available components, such as those that may be found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A stable p-type lithium (Li) and a transition metal codoped zinc oxide (ZnO) thin film comprising, at room temperature, a resistivity selected from a range of about 0.01 to 1 $\Omega$cm, a hole concentration selected from a range of about $10^{17}$ cm$^{-3}$ to $10^{18}$ cm$^{-3}$, and a mobility selected from a range of about 80 to 250 cm$^2$V$^{-1}$s$^{-1}$, the hole concentration remaining within ±20% of an initial value for about 100 days after the p-type Li and the transition metal codoped ZnO thin film is deposited.

2. The thin film of claim 1, wherein the transition metal is nickel (Ni).

3. The thin film of claim 1, wherein the resistivity is about 0.15 $\Omega$cm, the hole concentration is about 3.2*$10^{17}$ cm$^{-3}$, and the mobility is about 130 cm$^2$V$^{-1}$s$^{-1}$.

4. A device, comprising:
a substrate;
a zinc oxide (ZnO) buffer layer;
an n-type ZnO layer over the ZnO buffer layer;
a p-type lithium (Li) and a transition metal codoped ZnO layer over the n-type ZnO layer, the p-type Li and the transition metal codoped ZnO layer comprising, at room temperature, a resistivity selected from a range of about 0.01 to 1 $\Omega$cm, a hole concentration selected from a range of about $10^{17}$ cm$^{-3}$ to $10^{18}$ cm$^{-3}$, and a mobility selected from a range of about 80 to 250 cm$^2$V$^{-1}$s$^{-1}$, the hole concentration remaining within ±20% of an initial value for about 100 days after the p-type Li and the transition metal codoped ZnO thin film is deposited;
a first electrode coupled to the n-type ZnO layer; and
a second electrode coupled to the p-type ZnO layer.

5. The device of claim 4, wherein the transition metal is nickel (Ni).

6. The device of claim 5, wherein the resistivity is about 0.15 $\Omega$cm, the hole concentration is about 3.2*$10^{17}$ cm$^{-3}$, and the mobility is about 130 cm$^2$V$^{-1}$s$^{-1}$.

7. The device of claim 4, wherein the substrate is sapphire.

8. The device of claim 4, wherein the p-type Li and the transition metal codoped ZnO layer has a thickness of about 500 nm.

9. The device of claim 4, wherein the ZnO buffer layer has a thickness of about 100 nm.

10. The device of claim 4, wherein the n-type ZnO layer comprises a Al doped ZnO layer.

11. The device of claim 10, wherein the Al doped ZnO layer comprises about two mol % of Al.

12. The device of claim 10, wherein the Al doped ZnO layer has a thickness of about 500 nm.

13. The device of claim 4, wherein the device is a light-emitting diode.

14. A device, comprising:
a substrate; and
a p-type lithium (Li) and a transition metal codoped zinc oxide (ZnO) layer over the substrate, the p-type Li and the transition metal codoped ZnO layer comprising, at room temperature, a resistivity selected from a range of about 0.01 to 1 $\Omega$cm, a hole concentration selected from a range of about $10^{17}$ cm$^{-3}$ to $10^{18}$ cm$^{-3}$, and a mobility selected from a range of about 80 to 250 cm$^2$V$^{-1}$s$^{-1}$, the hole concentration remaining within ±20% of an initial value for about 100 days after the p-type Li and the transition metal codoped ZnO layer is deposited.

15. The device of claim 14, further comprising:
a buffer layer over the substrate.

16. The device of claim 15, wherein the buffer layer comprises an undoped intrinsic ZnO layer.

17. The device of claim 14, further comprising:
an n-type layer over the buffer layer.

18. The device of claim 17, wherein the n-type layer comprises an aluminum (Al) doped ZnO layer.

19. The device of claim 17, wherein the p-type Li and the transition metal codoped ZnO layer is formed atop the n-type layer to form a homojunction.

20. The device of claim 14, wherein the device is a light-emitting device.

* * * * *

UNITED STATES PATENT AND TRADEMARK OFFICE
CERTIFICATE OF CORRECTION

PATENT NO.        : 8,395,152 B2                                    Page 1 of 1
APPLICATION NO.   : 13/448472
DATED             : March 12, 2013
INVENTOR(S)       : Rao et al.

It is certified that error appears in the above-identified patent and that said Letters Patent is hereby corrected as shown below:

On the Title Page, Item (56), under "OTHER PUBLICATIONS", in Column 2, Line 29, delete "10.106311.2898505." and insert -- 10.1063/1.2898505. --, therefor.

On Title Page 2, Item (56), under "OTHER PUBLICATIONS", in Column 1, Line 25, delete "10.1063/12888578." and insert -- 10.1063/1.2888578. --, therefor.

In the Specifications

In Column 6, Lines 4-10, delete "The area.....$Ni^{3+}$." and insert the same after "respectively.", at Line 3, therefor as a continuation of the paragraph.

Signed and Sealed this
Eleventh Day of June, 2013

Teresa Stanek Rea
*Acting Director of the United States Patent and Trademark Office*